United States Patent
Tomerlin et al.

(10) Patent No.: US 6,937,669 B2
(45) Date of Patent: Aug. 30, 2005

(54) DIGITAL PREDISTORTION SYSTEM FOR LINEARIZING A POWER AMPLIFIER

(75) Inventors: Andrew T. Tomerlin, Coral Springs, FL (US); Asad Ullah Aman, Roselle, IL (US); Robert V. Stephens, Bartlett, IL (US)

(73) Assignee: Motorola, Inc., Schaumburg, IL (US)

(*) Notice: Subject to any disclaimer, the term of this patent is extended or adjusted under 35 U.S.C. 154(b) by 192 days.

(21) Appl. No.: 10/308,831

(22) Filed: Dec. 3, 2002

(65) Prior Publication Data
US 2004/0105510 A1 Jun. 3, 2004

(51) Int. Cl.⁷ .............................................. H04L 25/49
(52) U.S. Cl. ................................... 375/297; 455/114.3
(58) Field of Search ................................ 375/232, 297; 330/149, 150; 455/114.3, 126

(56) References Cited

U.S. PATENT DOCUMENTS

| | | | |
|---|---|---|---|
| 6,281,936 B1 | 8/2001 | Twitchell et al. | |
| 6,342,810 B1 | 1/2002 | Wright et al. | |
| 6,570,444 B2 * | 5/2003 | Wright | 330/149 |
| 2002/0027958 A1 * | 3/2002 | Kolanek | 375/297 |
| 2003/0053552 A1 * | 3/2003 | Hongo et al. | 375/297 |

* cited by examiner

Primary Examiner—Betsy L. Deppe

(57) ABSTRACT

A predistortion linear power amplifier utilizes several predistortion computation engines to receive a first carrier signal. The predistortion computation engines also receive input from a predistortion algorithm engine. The predistortion algorithm engine receives its data from a predistortion amplifier sensor that monitors the operating characteristics of the amplifier and also from a feedback control circuit that provides frequency correlated input and feedback data. The processed data from the predistortion algorithm engine is then input into the predistortion computation engine along with the carrier signal. An output combiner circuit takes the output of each predistortion computation engine and generates a single correction estimate, which is then input into the nonlinear amplifier for producing a substantially linear output signal.

13 Claims, 5 Drawing Sheets

FIG. 1 —PRIOR ART—

DIGITAL PREDISTORTION SYSTEM FOR LINEARIZING A POWER AMPLIFIER

FIELD OF THE INVENTION

The present invention relates generally to signal amplification and, more particularly, to a digital predistortion system for linearizing the output of a power amplifier.

BACKGROUND OF THE INVENTION

Power amplifiers are used in a wide variety of applications, such as in communications systems for increasing the signal strength of wireless transmissions from a basestation to a wireless handset while reducing interference. In an ideal linear power amplifier, the output power equals the input power multiplied by a constant that does not vary with the input power. In existing communications systems, the power amplifier is the final active component in a basestation transmit path, and is, unfortunately, subject to nonlinearities that add noise and cause distortion. In particular, typical amplifiers become quickly and significantly non-linear at relatively low output.

Of the existing technologies, there are at least two techniques that are used in attempting to linearize the output from the power amplifier to improve the signal handling capability of the power amplifier to enable the power amplifier to operate efficiently at higher power levels or to handle multiple carriers. These include feed-forward and digital predistortion. Both feed-forward and digital predistortion systems monitor the output of the power amplifier and use this information to ensure that the amplified signal is linear. Feed-forward systems combine signals from before and after amplification to generate a distortion-canceling signal. This signal is amplified by a separate error amplifier and combined with the power amplifier output in an attempt to create a linear result. A particular disadvantage of the feed-forward system is the expense associated with requiring a second amplifier.

In a digital predistortion system, the signal is corrected prior to being upconverted to radio frequency. That is, the signal entering the power amplifier is artificially distorted according to the inverse characteristic of the amplifier. Thus, the output signal is simply an amplified replica of the original signal before predistortion.

FIG. 1 illustrates a conventional predistortion linear power amplifier 10 that uses serial intermodulation distortion (IMD) cancellation. The predistortion linear power amplifier 10 includes a predistortor 12. A signal splitter 14, power amplifiers 16 and 20 and a combiner 18 form the main power amplifier. The power amplifiers 16 and 20 are identical.

The predistortor 12, as known in the art, is used to generate, for example, a third order intermodulation distortion signal that is used to cancel the intermodulation distortion generated by the main amplifier due to the nonlinearity. The predistortor 12 and the main power amplifier are coupled in series. The predistortor 12 introduces a gain loss for the carrier signal so more amplification stages are required to compensate for the loss. For example, the predistortor 12 generates intermodulation distortion that is 180 degrees out of phase with the intermodulation distortion generated by the main amplifier. The intermodulation distortion is effectively added to the carrier signal and subsequently split into two paths by the signal splitter 14.

The power amplifiers 16 and 20 amplify the intermodulation distortion as well as the carrier signal. Due to the nonlinearity of the power amplifiers 16 and 20, the output signal from the main amplifier includes carrier signal, intermodulation distortion generated by the predistortor 12 and the intermodulation distortion generated by the power amplifiers 16 and 20. Since the intermodulation distortion generated by the predistortor 12 has the same magnitude, but is 180 degrees out of phase compared to the distortion generated by the main amplifier, the total intermodulation distortion of the output signal is significantly reduced. The combiner 18 (e.g., quadrature coupler) then combines the split carrier signal. This arrangement is typically an open loop arrangement.

A disadvantage of existing predistortion systems is their inability to adjust for an inaccurate correction estimate, which could result in an ineffectual attempt at linearization. Additionally, existing predistortion systems are able to execute only a single adaptation algorithm at one time, possibly leading to less than optimal results.

DETAILED DESCRIPTION

The predistortion linear power amplifier and method of the present invention employs parallel predistortion cancellation using multiple predistortion computation engines (PDE's) to correct for wideband distortion, inter-modulation products and memory effects that arise in a power amplifier.

In one embodiment, the predistortion linear power amplifier utilizes several PDE's to receive a first carrier signal. The PDE's also receive input from a predistortion algorithm engine (PAE), which generates a control signal that compensates for the changes in the characteristics of the nonlinear amplifier. The PAE receives its data from a predistortion amplifier sensor (AS) that monitors the operating characteristics of the amplifier and also from a feedback control circuit (FCC) that provides frequency correlated input and feedback data.

The processed data from the predistortion algorithm engine (PAE) and carrier signal are inputs into the PDE's. An output combiner circuit (CC) then takes the output of each PDE and generates a single correction estimate, which is then input into the nonlinear amplifier. This results in an output signal from which nonlinear distortion has been substantially cancelled.

Compared with conventional and known predistortion linear power amplifiers, the above described linear power amplifier provides a more robust and rapid response to memory effects due to the use of multiple predistortion computation engines. A particular advantage of utilizing several PDE's is the ability to support several correction algorithms at any time, thereby decreasing algorithm instability and improving algorithm convergence.

Figure 1:
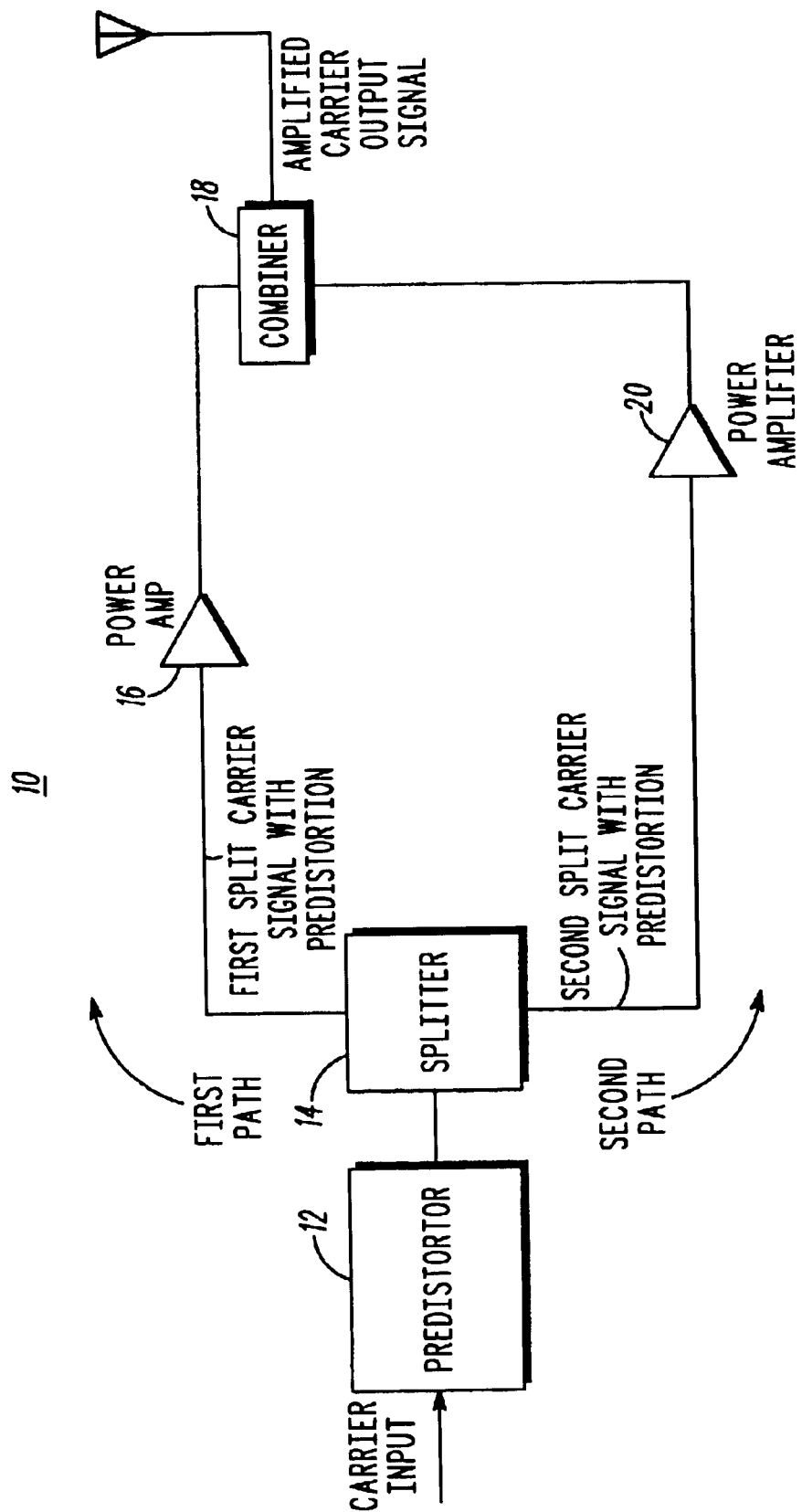
FIG. 1 is a schematic diagram of a prior art digital predistortion system.
Figure 2:
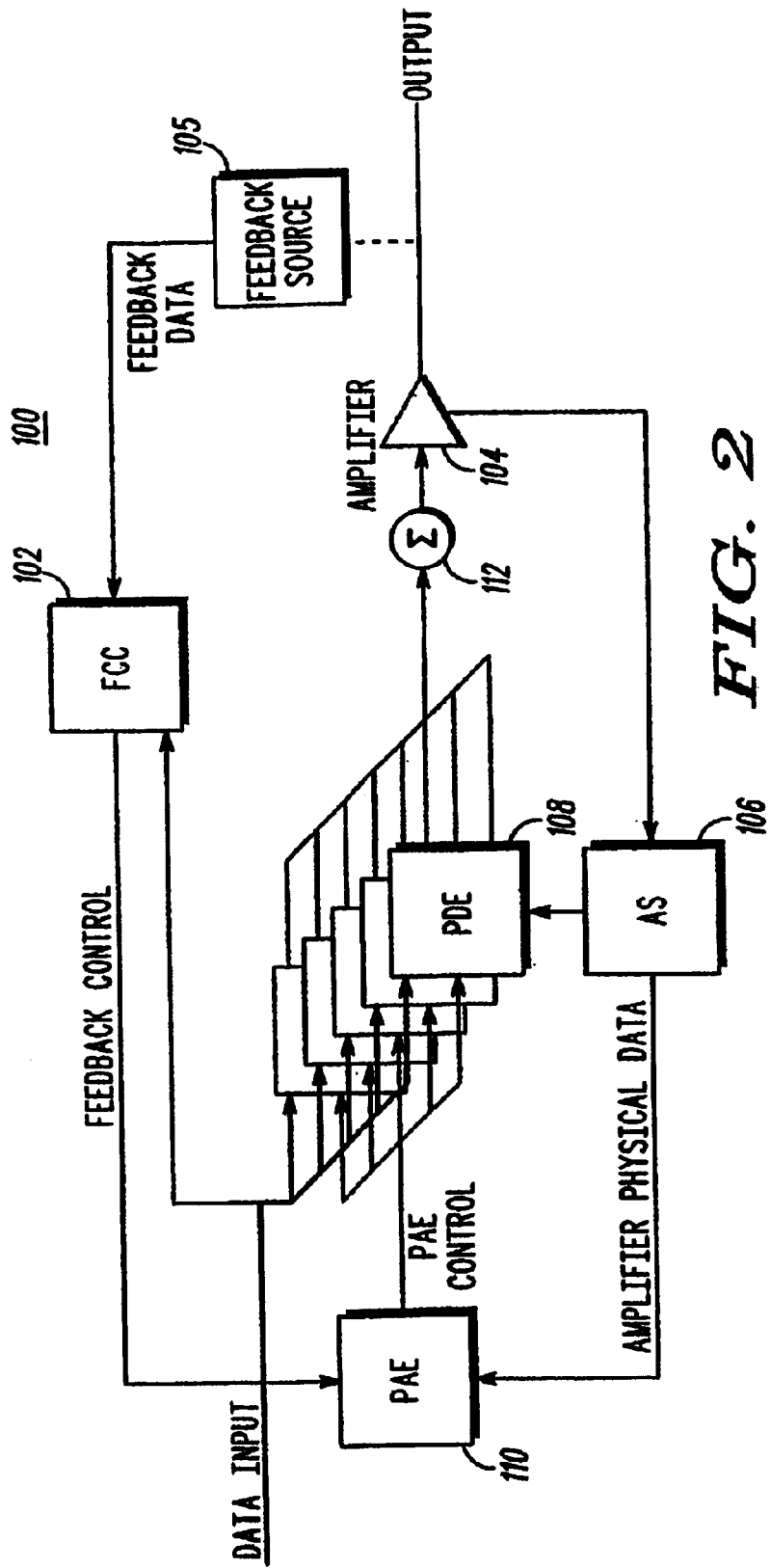
FIG. 2 is a schematic diagram of a digital predistortion system in accordance with an embodiment of the present invention.

FIG. 2 illustrates an example of a linear power amplifier 100 that employs digital predistortion based parallel cancellation in accordance with the present invention. The linear power amplifier 100 may be used in any system that requires a power amplifier, such as a suitable wireless transmitter or transmission system, including, for example, a microwave frequency based wireless communication system. The present invention also finds utility in cellular basestations and software definable modern technology.

The linear power amplifier 100 includes a feedback control circuit (FCC) 102, a main power amplifier 104, an amplifier sensor (AS) 106, several predistortion computation engines (PDEs) 108, 108', a predistortion algorithm engine (PAE) 110 and a predistortion output combiner circuit (CC) 112. As shown, data input, which generally includes multi-carrier baseband signals, is fed into the PDE's 108, 108'.

The FCC 102, which may be an ASIC, FPGA, DSP, reconfigurable fabric or other suitable device, contains two sets of K parallel digital passband filters that digitally filter the multi-carrier input and correlated amplifier output. The sum of all K passbands comprises the whole digital baseband. Significantly, one or more carriers may be present in any one passband.

Figure 3:
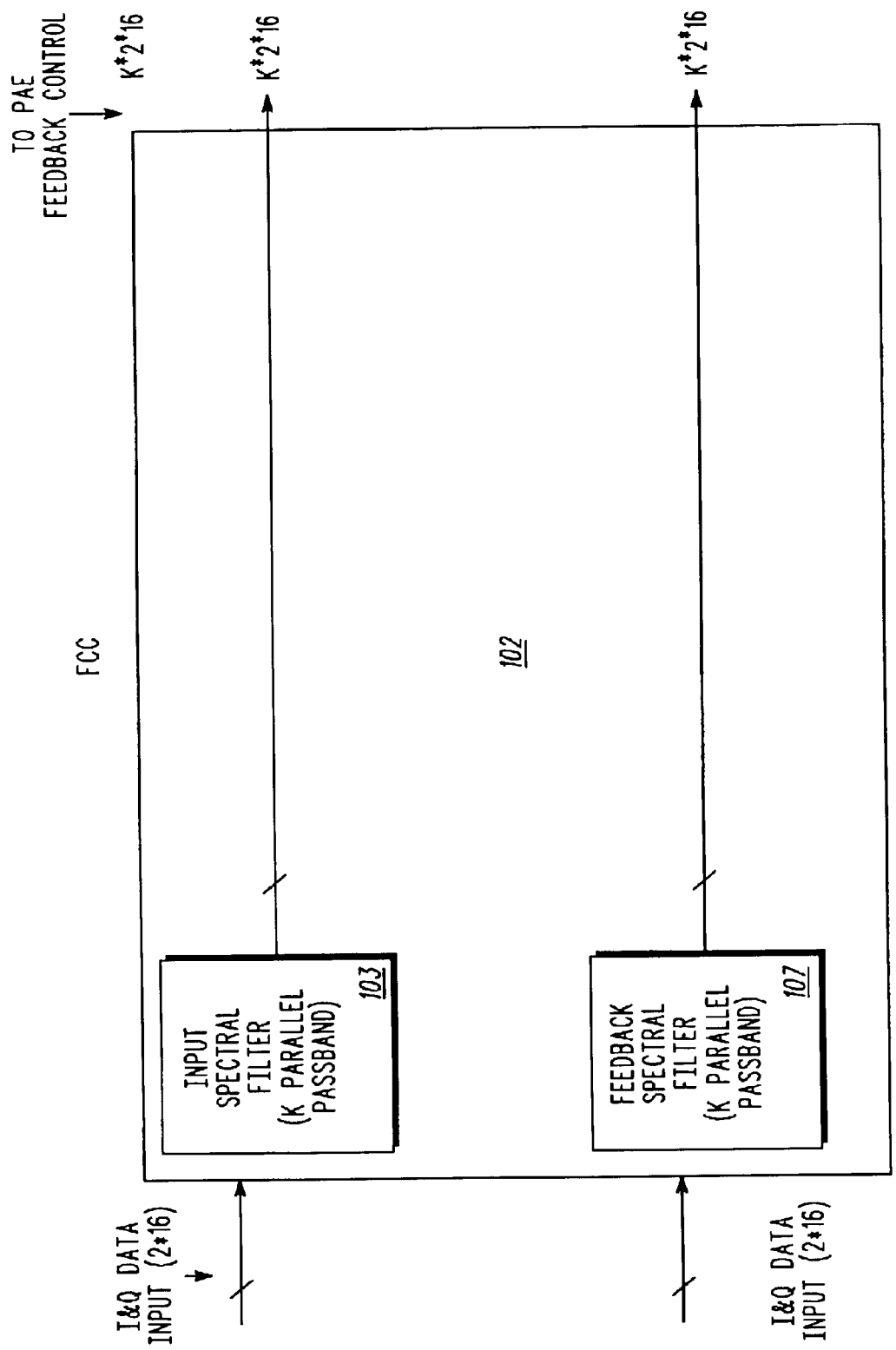
FIG. 3 is a schematic diagram of the feedback control circuit (FCC) of FIG. 2 in accordance with an embodiment of the present invention.

Referring to FIG. 3, the FCC 102 includes an input spectral filter 103 and a feedback spectral filter 107. The FCC 102 spectrally separates the multi-carrier baseband I, Q input and correlated I, Q (downconverted and A/D'd) output of the amplifier 104 from the feedback source 105 into several passband "bins", where the sum of all the bins comprises the whole digital baseband. Again, it is to be noted that one or more carriers may be present in any one bin. This is accomplished using the parallel digital passband filters. As a result, frequency-correlated input and feedback data for use in the PAE 110 is obtained.

The AS 106 monitors the physical characteristics of the amplifier 104. In particular, the AS 106 monitors die temperature, temperature gradient and other data within the amplifier 104. This data is then fed back into the PDE's 108, 108' address circuit for creating a multidimensional index within the PDE's look-up-table, as further described below. Significantly, it is likely that the physical parameters of the amplifier 104 change according to the operation of the amplifier. Advantageously, as a result the AS 106 provides dynamic data to the PAE 110. This, in turn, results in the most current and accurate data being processed by the linear power amplifier 100.

Figure 4:
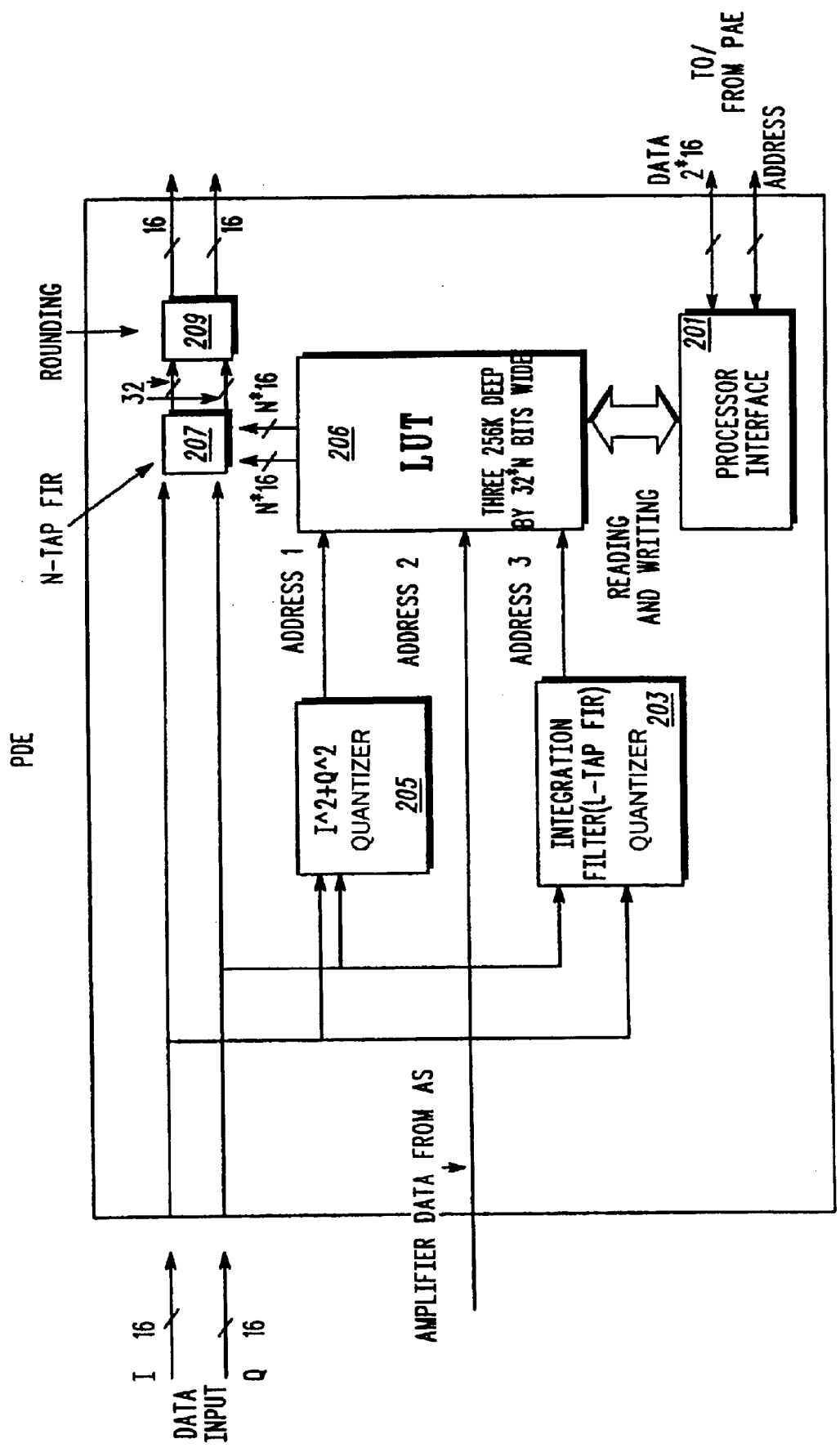
FIG. 4 is a schematic diagram of the predistortion computation engine (PDE) of FIG. 2 in accordance with an embodiment of the present invention.

As shown in FIG. 4, the PDE's 108, 108', which also may be in the form of an ASIC, FPGA, DSP, reconfigurable fabric or any other suitable device, are operatively coupled through a processor interface 201 to receive a compensated signal from the PAE 110 and to output updated signals to the CC 112. Each PDE includes an addressing circuit, which includes a quantizer 205 and an integration filter quantizer 203, a Finite Impulse Response (FIR) filter 207 (such as a frequency sampling filter) and a look-up table (LUT) 206. The PDE digitally compensates for the frequency dependent AM—AM and AM-PM characteristics of the nonlinear amplifier 104.

The addressing circuit 203, 205 uses the amplifier data and I, Q baseband input (i.e. generates input amplitude, input signal envelope, and input delayed signal) to generate an address. The input I, Q data is digitally compensated in the FIR filter 207. The FIR coefficients, which are stored in the LUT 206, are obtained and determined from AM—AM and AM-PM data at varying frequencies.

More particularly, the integration filter quantizer 203 takes the baseband I,Q input and computes an integrated signal envelope to produce an address (e.g. address 3). The quantizer 205 takes the I,Q baseband input and computes the square of the signal amplitude, $I^2+Q^2$, to produce an address (e.g. Address 1). All three addresses combined (address 1, 2 and 3) form a composite address in the LUT 206 that stores FIR coefficients. The FIR coefficients are then loaded into the FIR 207 and the I,Q baseband input is compensated in the FIR filter 207. The output of the FIR filter 207 is the predistorted I,Q baseband signal. Note that the amplifier data (address 2) includes, among other things, die temperature and temperature gradient.

Coefficient rounding of the FIR output, which is needed prior to digital to analog conversion, occurs in the rounding block 209 in series after the FIR filter 207 generates amplitude, integrated signal envelope, delayed signal and amplifier data.

A particular advantage of the PDE's 108, 108' over the prior art is that the use of several PDE's enables the supporting of several sets of FIR coefficients. Accordingly, several adaptation algorithms can be supported at one time. Thus, if one adaptation algorithm gives an unstable correction estimate, the unstable estimate is, in effect, averaged out by the others.

Figure 5:
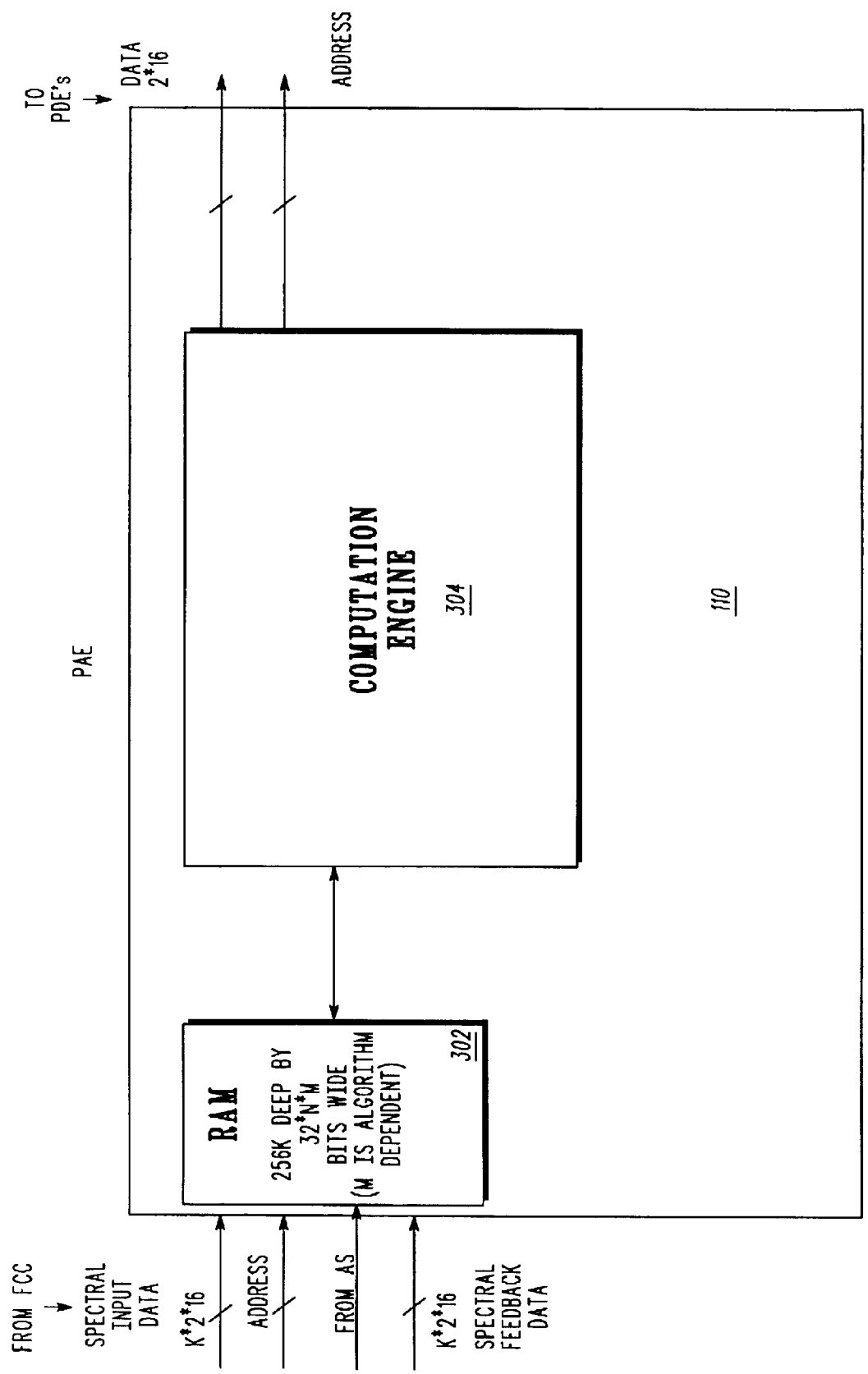
FIG. 5 is a schematic diagram of the predistortion algorithm engine (PAE) of FIG. 2 in accordance with an embodiment of the present invention.

As shown in FIG. 5, the PAE 110, which is operatively coupled to the AS 106, the PDE 108, 108' and the FCC 102, includes memory, such as RAM 302, and a computation block 304, which may be a microcontroller, microprocessor or other such computing device. The PAE may be in the form of DSP, reconfigurable fabric or other suitable device.

The PAE 110 compensates for the changes (due to memory effects, thermal effects, etc.) of the frequency dependant AM—AM and AM-PM characteristics of the nonlinear amplifier 104. The PAE 110 updates the FIR 207 coefficients stored in each PDE's LUT 206 on a per visit rate. It is to be noted that the FIR (coefficient) update is dependent on how often the inverse amplifier characteristics contained in the LUT (the FIR coefficients are the inverse amplifier characteristics) are to be updated. Accordingly, the FIR update can be programmable and the update performed according to the operating conditions of the amplifier. For example, a stable amplifier, whose AM—AM and AM-PM characteristics do not change very drastically over an operating period of 5 minutes, may only require an update every 5 minutes.

The PAE 110 takes frequency correlated input/output data from the FCC 102, stores the data in the RAM 302 and performs an FIR (coefficient) update. The FIR update is performed in the computation block 304 using the data stored in the RAM 302. The method of the update is dependent on the particular algorithm being used (LMS, RLS, ARMA, LS, etc.). Since the PAE 110 updates several PDE's LUTs, the PAE 110 is able to use different adaptation algorithms for different PDE's as needed. For example, a first LUT can be updated with an LMS algorithm while another LUT can be updated with an ARMA algorithm. Thus, a particular advantage of the present system is the ability of the PAE 110 to support several adaptation algorithms anytime.

The output from the PDE's 108, 108', which are now updated, are then input into the CC 112. The CC 112 takes the output of each PDE 108, 108', multiplies each PDE output with a weighting factor and then sums the products to obtain the corrected signal. In essence, the CC 112 "averages" the correction estimates from each PDE output to obtain a linear combination of estimates. This helps in reducing the effect of an error in a PDE output. The amplifier 104, which is operatively coupled to and receives the output from the CC 112 then outputs a corrected and substantially linear signal.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A linear power amplifier for amplifying an input carrier signal comprising:

a nonlinear amplifier for amplifying an input signal;

a plurality of predistortion computation engines operatively coupled to the nonlinear amplifier for digitally compensating for one or more characteristics of the nonlinear amplifier; and a predistortion algorithm engine operatively coupled to the predistortion computation engines for receiving data from the amplifier and the predistortion computation engines and outputting processed data to the predistortion computation engines;

wherein the predistortion algorithm engine is configured to support several different adaptation algorithms at any time;

further wherein at least two of the predistortion computation engines simultaneously utilize different adaptation algorithms from the several different adaptation algorithms.

2. The linear power amplifier of claim 1 further comprising a combiner circuit for combining correction estimates outputted by each of the predistortion computation engines.

3. The linear power amplifier of claim 1 further comprising a feedback control circuit for processing a baseband signal and generating feedback data for use by the predistortion algorithm engine.

4. The linear power amplifier of claim 1 further comprising an amplifier sensor operatively coupled to the amplifier for sensing amplifier operating characteristics.

5. The linear power amplifier of claim 3, wherein the feedback control circuit comprises:

an input spectral filter for separating multi-carrier baseband input; and a feedback spectral filter for correlating baseband output of the amplifier from a feedback source.

6. The linear power amplifier of claim 1, wherein each of the predistortion computation engines comprise:

an addressing circuit for generating an address using amplifier data and input carrier signals to generate an address;

finite impulse response filter for providing inverse amplifier characteristics; and a lookup table for storing finite impulse response coefficients generated by the predistortion algorithm engine at the address generated by the addressing circuit.

7. The linear power amplifier of claim 1, wherein the predistortion algorithm engine comprises:

a memory for storing input data; and a computation engine for performing a finite impulse response coefficient update using the data stored in the memory.

8. The linear power amplifier of claim 1 further comprising:

a feedback control circuit having frequency correlated input/output data that are outputted to the predistortion algorithm engine;

wherein the predistortion algorithm engine performs a finite impulse response coefficient update on the frequency correlated input/output data.

9. A method for providing linear amplification comprising the steps of:

receiving a carrier signal and a compensation signal indicative of the operating characteristics of a non-linear power amplifier into a plurality of predistortion computation engines;

calculating a single correction estimate from a plurality of output signals generated by the plurality of predistortion computation engines;

inputting the single correction estimate into the non-linear power amplifier for outputting a linearized signal;

generating the compensation signal using a predistortion algorithm engine that receives frequency correlated input/output data from a feedback control circuit and performs a finite impulse response coefficient update on the received data;

configuring the predistortion algorithm engine to support several different adaptation algorithms at any time; and utilizing simultaneously different adaptation algorithms from the several different adaptation algorithms for at least two of the predistortion computation engines.

10. The method of claim 9, wherein the calculating step further comprises the steps of:

receiving a plurality of predistortion computation engine output signals;

multiplying each output signal with a weighting factor; and summing the multiplied output signals for generating the single correction estimate.

11. The method of claim 9, wherein the utilizing step comprises the step of updating a look-up table in each predistortion computation engine, wherein each look-up table is updated using one of the different adaptation algorithms.

12. The method of claim 9, wherein the receiving step further comprises the step of configuring the compensation signal to comprise non-linear amplifier physical characteristic data.

13. The method of claim 9, wherein the receiving step further comprises the step of dynamically updating the compensation signal.

* * * * *